(12) United States Patent
Kurosaki et al.

(10) Patent No.: US 11,424,398 B2
(45) Date of Patent: Aug. 23, 2022

(54) THERMOELECTRIC CONVERSION MATERIAL AND THERMOELECTRIC CONVERSION MODULE

(71) Applicant: Hitachi, Ltd., Tokyo (JP)

(72) Inventors: Yosuke Kurosaki, Tokyo (JP); Shin Yabuuchi, Tokyo (JP); Jun Hayakawa, Tokyo (JP); Yuzuru Miyazaki, Sendai (JP); Tomohisa Takamatsu, Sendai (JP); Kei Hayashi, Sendai (JP)

(73) Assignee: Hitachi, Ltd., Tokyo (JP)

( * ) Notice: Subject to any disclaimer, the term of this patent is extended or adjusted under 35 U.S.C. 154(b) by 6 days.

(21) Appl. No.: 16/843,454

(22) Filed: Apr. 8, 2020

(65) Prior Publication Data

US 2020/0328336 A1    Oct. 15, 2020

(30) Foreign Application Priority Data

Apr. 10, 2019    (JP) .............................. JP2019-074706

(51) Int. Cl.
*H01L 35/22*    (2006.01)
*H01L 35/12*    (2006.01)
*H01L 35/32*    (2006.01)

(52) U.S. Cl.
CPC .............. *H01L 35/22* (2013.01); *H01L 35/12* (2013.01); *H01L 35/32* (2013.01)

(58) Field of Classification Search
CPC .......... H01L 35/12; H01L 35/22; H01L 35/32
See application file for complete search history.

(56) References Cited

U.S. PATENT DOCUMENTS

2002/0024154 A1*  2/2002  Hara .................. H01L 23/38
                                                  257/712
2006/0118159 A1*  6/2006  Tsuneoka ............ H01L 35/32
                                                  136/211

FOREIGN PATENT DOCUMENTS

JP    2015-51883 A    3/2015
JP    2016-164960 A   9/2016

OTHER PUBLICATIONS

Sasaki et al. "Tuning valence electron concentration in the Mo13Ge23—Ru2Ge3 pseudobinary system for enhancement of the thermoelectric properties", Journal of Applied Physics 125, 025108, pp. 1-6. (Year: 2019).*

Aoyama et al., "Effects of Ge Doping on Micromorphology of MnSi in MnSi~1.7 and on Their Thermoelectric Transport Properties", Japanese Journal of Applied Physics, vol. 44, No. 12, pp. 8562-8570. (Year: 2005).*

(Continued)

*Primary Examiner* — Tamir Ayad
(74) *Attorney, Agent, or Firm* — Crowell & Moring LLP

(57) ABSTRACT

The present invention improves the performance of a thermoelectric conversion material and a thermoelectric conversion module. A thermoelectric conversion material has a mother phase containing a chimney ladder type compound comprising a first element of groups 4 to 9 and a second element of groups 13 to 15 and an additive phase existing at a grain boundary of the mother phase, the mother phase contains a third element to change a lattice constant of the chimney ladder type compound, and the additive phase contains the second element.

13 Claims, 9 Drawing Sheets

101: THERMOELECTRIC CONVERSION MATERIAL
102: MOTHER PHASE
103: ADDITIVE PHASE

(56) References Cited

OTHER PUBLICATIONS

Shin, Dong-Kil et al., "Solid-State Synthesis and Thermoelectric Properties of Cr-doped MnSi1.75-δ", Journal of Electronic Materials, vol. 43, No. 6, pp. 2104-2108. (Year: 2014).*
Zhou, A.J. et al., "Microstructure and thermoelectric properties of SiGe-added higher manganese silicides", Materials Chemistry and Physics 124, pp. 1001-1005. (Year: 2010).*
Miyazaki, Yuzuru et al., "Preparation and Thermoelectric Properties of a Chimney-Ladder (Mn1-xFex)Si$\gamma$ ($\gamma$~1.7) Solid Solution", Japanese Journal of Applied Physics, 50, 035804. (Year: 2011).*
Kikuchi, Yuta et al., "Enhanced Thermoelectric Performance of a Chimney-Ladder (Mn1-xCrx)Si$\gamma$ ($\gamma$~1.7) Solid Solution", Japanese Journal of Applied Physics, 51, 085801 (Year: 2012).*

\* cited by examiner

101: THERMOELECTRIC CONVERSION MATERIAL
102: MOTHER PHASE
103: ADDITIVE PHASE

OUTPUT

THERMOELECTRIC CONVERSION MATERIAL AND THERMOELECTRIC CONVERSION MODULE

BACKGROUND

The present invention relates to a thermoelectric conversion material and a thermoelectric conversion module using the thermoelectric conversion material.

In recent years, research and development on effective utilization of energy is flourishing but about 60% of energy is discarded as heat in the process up to the final consumption of primary energy, mainly coal and oil. Development of waste heat reuse technology therefore is required. In particular, waste heat power conversion technology is one of the biggest requirements and a technology to realize this is a thermoelectric conversion system comprising a thermoelectric conversion module (thermoelectric conversion element) using Seebeck effect. The thermoelectric conversion system is scalable and turbine-less and therefore highly versatile.

In Japanese Unexamined Patent Application Publication Nos. 2016-164960 and 2015-51883 for example, a composite material structure of combining a mother material and a dissimilar material is described and, in Japanese Unexamined Patent Application Publication No. 2016-164960 in particular, a thermoelectric conversion element including the composite material structure as a thermoelectric conversion material is described.

SUMMARY

The present inventors examine the configuration of a thermoelectric conversion material used for a thermoelectric conversion module in detail. The improvement of the performance of a thermoelectric conversion material and a thermoelectric conversion module by devising the configuration of the thermoelectric conversion material is desired.

The other problems and novel features will be obvious from the descriptions and attached drawings in this specification.

A thermoelectric conversion material according to an embodiment has a mother phase containing a chimney ladder type compound comprising a first element of groups 4 to 9 and a second element of groups 13 to 15 and an additive phase existing at a grain boundary of the mother phase in which: the mother phase contains a third element that changes a lattice constant of the chimney ladder type compound; and the additive phase contains the second element.

The embodiment makes it possible to improve the performance of a thermoelectric conversion material and a thermoelectric conversion module.

DETAILED DESCRIPTION

Figure 1:
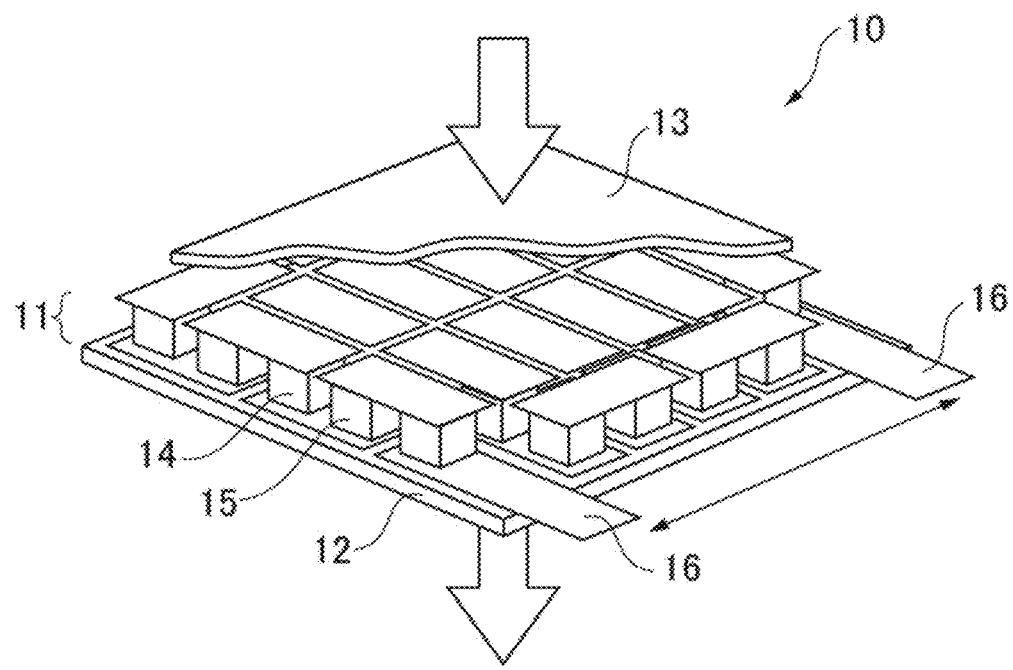
FIG. 1 is a schematic perspective view showing a substantial part of a thermoelectric conversion module according to an embodiment.

Embodiments according to the present invention are explained hereunder in detail in reference to drawings. Here, in all the drawings for explaining the embodiments, members having the same function are denoted by the same reference numerals and their repeated description is omitted. Further, in the following embodiments, unless otherwise required, the description of the same or similar parts will not be repeated in principle.

(Examination Items)

Items examined by the present inventors are explained hereunder before the embodiments are explained.

A thermoelectric conversion module contains p-type and n-type thermoelectric conversion materials and a thermoelectric conversion efficiency of the thermoelectric conversion module depends strongly on the properties of the thermoelectric conversion materials (thermoelectric properties). Firstly therefore, the properties of the thermoelectric conversion materials (thermoelectric performance) are explained. A dimensionless figure of merit ZT for evaluating a thermoelectric conversion material is shown by the following expression.

$$ZT=S^2T/\rho\kappa=S^2T/\rho(\kappa_e+\kappa_{ph})$$

In the expression, S represents a Seebeck coefficient, T an absolute temperature, $\rho$ a specific resistance, $\kappa$ a thermal conductivity, $\kappa_e$ a thermal conductivity by a carrier, and $\kappa_{ph}$ a thermal conductivity by a lattice. As a dimensionless figure of merit ZT increases, a thermoelectric conversion efficiency increases and an excellent thermoelectric conversion material is obtained.

Here, S, ρ and $\kappa_e$ are functions of a carrier density respectively and, when a carrier density in a thermoelectric conversion material is high, S and ρ are small and $\kappa_e$ is large. In contrast, when a carrier density in a thermoelectric conversion material is low, S and ρ are large and $\kappa_e$ is small. A carrier density of a thermoelectric conversion material therefore has an optimum value. In general, a carrier density of a thermoelectric conversion material is optimized so as to increase an output factor $S^2/\rho$ comprising S and ρ, which are highly dependent on a carrier density.

Further, in the above expression, since $\kappa_{ph}$ does not depend on a carrier density, $\kappa_{ph}$ can be reduced by controlling the crystal structure of a thermoelectric conversion material.

From the above, in order to increase a dimensionless figure of merit ZT in a thermoelectric conversion material, (1) selection of a thermoelectric conversion material, (2) optimization of a carrier density in a thermoelectric conversion material for maximizing $S^2/\rho$, and (3) reduction of $\kappa_{ph}$ of a thermoelectric conversion material are required.

Firstly, as (1) selection of a thermoelectric conversion material, the present inventors have focused on a chimney ladder type compound. The chimney ladder type compound: is a compound $MX_\gamma$ comprising a group 4 to 9 metal M and a group 13 to 15 element X; and takes a structure of arranging X atoms of a spiral lattice (ladder) in a square prism lattice (chimney) comprising M atoms. Here, γ is a composition ratio of X to M, and takes a value in the range of 1 to 2. A chimney ladder type compound $MX_\gamma$ is a promising material as a thermoelectric conversion material because an environmentally friendly and inexpensive material can be selected, most of the compounds are semiconductors and the carrier density can be controlled easily, and $\kappa_{ph}$ lower than another compound can be expected because of a complicated crystal lattice.

Successively, (2) optimization of a carrier density in a thermoelectric conversion material for maximizing $S^2/\rho$ and (3) reduction of $\kappa_{ph}$ of a thermoelectric conversion material are explained.

Firstly, in order to change a carrier density in a thermoelectric conversion material, generally a first element constituting a mother material (mother phase) of the thermoelectric conversion material is replaced with an element having a valence different from the first element (element replacement). When element replacement is applied to a chimney ladder type compound $MX_\gamma$ that is a mother material of a thermoelectric conversion material however, the lattice constant of the mother material changes or a lattice defect is generated and hence γ also changes. Since γ is a composition ratio of X to M, the change of γ causes the carrier density of the thermoelectric conversion material to change. In this way, a final carrier density by element replacement is hardly predictable and hence it is difficult to control a carrier density by element replacement in a thermoelectric conversion material containing a chimney ladder type compound as a mother material.

Meanwhile, in order to reduce $\kappa_{ph}$ of a thermoelectric conversion material, generally an element (first element) constituting a mother material of the thermoelectric conversion material is replaced with an element (heavy element) having an atomic weight larger than the first element (element replacement). This is because, by replacing an element constituting a mother material with a heavy element, it is possible to (a) reduce a phonon group velocity, (b) increase phonon umklapp scattering, and (c) increase the scattering probability of phonons due to irregularities in a crystal structure. As stated above however, when element replacement is applied to a chimney ladder type compound $MX_\gamma$ that is a mother material of a thermoelectric conversion material, the lattice constant of the mother material changes or a lattice defect is generated and hence γ also changes. As γ changes therefore, the carrier density of the thermoelectric conversion material also changes. In this way, a final carrier density by element replacement is hardly predictable and hence it is difficult to reduce $\kappa_{ph}$ by element replacement in a thermoelectric conversion material containing a chimney ladder type compound as a mother material.

From the above, it is desired that a composition ratio γ can be easily controlled when element replacement is applied with the aim of optimizing a carrier density and reducing $\kappa_{ph}$ in a thermoelectric conversion material containing a chimney ladder type compound as a mother material.

EMBODIMENTS

[Thermoelectric Conversion Module]

Figure 2:
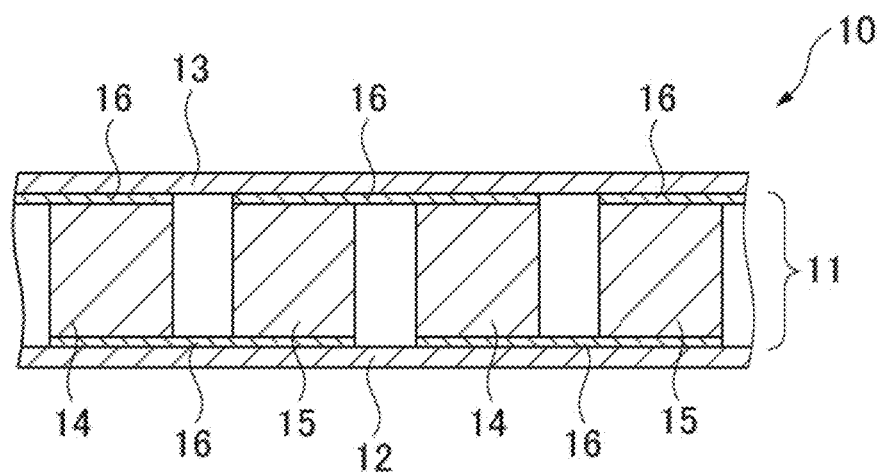
FIG. 2 is a schematic sectional view showing a substantial part of the thermoelectric conversion module shown in FIG. 1.

A thermoelectric conversion module (thermoelectric conversion element) according to the present embodiment is explained hereunder in reference to FIGS. 1 and 2. FIG. 1 is a schematic perspective view showing a substantial part of a thermoelectric conversion module according to the present embodiment. FIG. 2 is a schematic sectional view showing a substantial part of the thermoelectric conversion module shown in FIG. 1.

As shown in FIGS. 1 and 2, a thermoelectric conversion module 10 according to the present embodiment has a thermoelectric conversion section 11, a lower substrate 12, and an upper substrate 13. The thermoelectric conversion section 11 is interposed between the lower substrate 12 and the upper substrate 13. The thermoelectric conversion section 11 comprises a plurality of p-type thermoelectric conversion materials 14, a plurality of n-type thermoelectric conversion materials 15, and a plurality of electrodes 16. The p-type thermoelectric conversion materials 14 and the n-type thermoelectric conversion materials 15 are connected alternately with the electrodes 16 interposed. Such a thermoelectric conversion section 11 is called a π type.

In such a thermoelectric conversion module 10 as shown in FIG. 1, when a temperature difference is given between the lower substrate 12 and the upper substrate 13, voltages are generated by Seebeck effect in the p-type thermoelectric conversion materials 14 and the n-type thermoelectric conversion materials 15 contained in the thermoelectric conversion section 11, respectively. The thermoelectric conversion module 10 therefore can convert heat into electric energy by taking out the voltages generated in the p-type thermoelectric conversion materials 14 and the n-type thermoelectric conversion materials 15 to the exterior through the electrodes 16.

A thermoelectric conversion material 101 according to the present embodiment shown in FIG. 3 that will be described later can be adopted as the p-type thermoelectric conversion materials 14 in the thermoelectric conversion module 10 according to the present embodiment shown in FIGS. 1 and 2. A specific example of the thermoelectric conversion material 101 according to the present embodiment is $Mn(Si_{0.98}Ge_{0.02})_\gamma + SiGe$.

Further, the n-type thermoelectric conversion materials 15 in the thermoelectric conversion module 10 according to the present embodiment shown in FIGS. 1 and 2 can comprise Mg$_2$Si, for example.

[Thermoelectric Conversion Material]

<Configuration of Thermoelectric Conversion Material>

Figure 3:
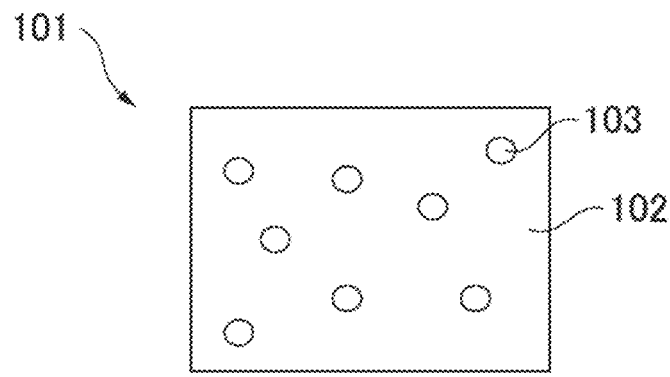
FIG. 3 is a schematic sectional view showing a configuration of a thermoelectric conversion material according to an embodiment.

A configuration of a thermoelectric conversion material according to the present embodiment is explained hereunder in reference to FIG. 3. FIG. 3 is a schematic sectional view showing a configuration of a thermoelectric conversion material according to the present embodiment.

As shown in FIG. 3, a thermoelectric conversion material 101 according to the present embodiment contains a mother phase 102 comprising a chimney ladder type compound and an additive phase 103 existing at a grain boundary of the mother phase 102. A chimney ladder type compound MX$_\gamma$ comprises an element (first element) M of groups 4 to 9 and an element (second element) X of groups 13 to 15. Here, γ represents a composition ratio of the second element X to the first element M in the chimney ladder type compound. The first element M is Mn, Fe, Ti, Ru, Rh, Mo, V, or Re, for example. Further, the second element X is Si, Ge, Ga, or Sn, for example.

Then the mother phase 102 contains an element (third element) Y. A part of the second element X in the chimney ladder type compound constituting the mother phase 102 therefore is replaced with the element Y. As a result, the chimney ladder type compound constituting the mother phase 102 has a composition of $M(X_{1-y}Y_y)_\gamma$. Further, as a part of the second element X in the chimney ladder type compound is replaced with the element Y, the composition ratio γ in the chimney ladder type compound MX$_\gamma$ changes. The element Y is Ge, Al, or Sn, for example. When an element (heavy element) having an atomic weight larger than the second element X is used as the element Y, $\kappa_{ph}$ of the thermoelectric conversion material 101 can be reduced as stated earlier.

Then the mother phase 102 contains an element (third element) Z. Apart of the first element M in the chimney ladder type compound constituting the mother phase 102 therefore is replaced with the element Z. As a result, the chimney ladder type compound constituting the mother phase 102 has a composition of $M_{1-z}Z_zX_\gamma$. Further, as apart of the first element M in the chimney ladder type compound is replaced with the element Z, the composition ratio γ in the chimney ladder type compound MX$_\gamma$ changes. The element Z is Cr, Re, Fe, W, Os, or Ir, for example. When an element having a valence different from the first element M is used as the element Z, a carrier density of the thermoelectric conversion material 101 can be changed largely as stated earlier. Then when an element (heavy element) having an atomic weight larger than the first element M is used as the element Z, $\kappa_{ph}$ of the thermoelectric conversion material 101 can be reduced as stated earlier.

Further, the additive phase 103 contains the second element X. Furthermore, the additive phase 103 contains an element (fourth element) T that forms a chemical compound with the second element X. The element T is Ge, Al, or Sn, for example.

Further, the mother phase 102 and the additive phase 103: do not form a chemical compound by any reaction of eutectic reaction, eutectoid reaction, peritectic reaction, peritectoid reaction, monotectic reaction, or segregation reaction; and exist in the states of separating from each other.

From the above, in the thermoelectric conversion material 101 according to the present embodiment, the composition of the mother phase 102 is $M_{1-z}Z_z(X_{1-y}Y_y)_\gamma$ and the composition of the additive phase 103 is $T_{1-x}X_x$. The composition of the thermoelectric conversion material 101 according to the present embodiment therefore is represented as $M_{1-z}Z_z(X_{1-y}Y_y)_\gamma + T_{1-x}X_x$ hereunder.

As a specific example according to the present embodiment, the mother phase 102 comprises a chimney ladder type compound MnSi$_\gamma$ (manganese silicide) using Mn (manganese) as the first element M and Si (silicon) as the second element X. Then the mother phase 102 contains Ge (germanium) as the element Y. Apart of Si in the chimney ladder type compound MnSi$_\gamma$ therefore is replaced with Ge and the chimney ladder type compound constituting the mother phase 102 has a composition of $Mn(Si_{1-y}Ge_y)_\gamma$.

Further, as a specific example according to the present embodiment, the additive phase 103 comprises SiGe (silicon germanium) using Ge as the element T.

Further, another specific example of a chimney ladder type compound constituting the mother phase 102 according to the present embodiment is a chimney ladder type compound FeGe$_\gamma$ using Fe (iron) as the first element M and Ge (germanium) as the second element X. On this occasion, FeGe$_2$ may be adopted as the additive phase 103 according to the present embodiment. That is, FeGe$_2$ constituting the additive phase 103 contains Ge that is the second element X. Further, the mother phase 102 comprising FeGe$_\gamma$ and the additive phase 103 comprising FeGe$_2$: do not form a chemical compound by any reaction of eutectic reaction, eutectoid reaction, peritectic reaction, peritectoid reaction, monotectic reaction, or segregation reaction; and exist in the states of separating from each other.

Further, yet other specific examples of a chimney ladder type compound constituting the mother phase 102 according to the present embodiment are TiSi$_2$, RuGa$_2$, Ru$_2$Si$_3$, Ru$_2$Sn$_3$, Rh$_{10}$Ga$_{17}$, Mo$_{13}$Ge$_{23}$, Rh$_{17}$Ge$_{22}$, V$_{17}$Ge$_{31}$, and Re$_4$Ge$_7$. Further, the mother phase 102 according to the present embodiment may contain, in such chimney ladder type compounds, a chemical compound of a partial element defect or a combination of those chimney ladder type compounds.

Then as the additive phase 103, a material that does not form a chemical compound with such chimney ladder type compounds constituting the mother phase 102 by any reaction of eutectic reaction, eutectoid reaction, peritectic reaction, peritectoid reaction, monotectic reaction, or segregation reaction can be adopted.

<Crystal Structure>

Figure 4:
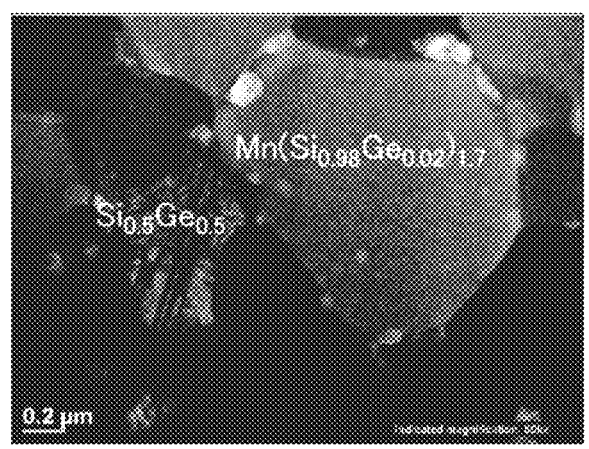
FIG. 4 is an electron micrographic image of a thermoelectric conversion material according to an embodiment.

A crystal structure of a thermoelectric conversion material according to the present embodiment is explained hereunder in reference to FIG. 4. FIG. 4 is an electron micrographic image of a thermoelectric conversion material according to the present embodiment.

As the thermoelectric conversion material explained below, a material formed as a sintered body by grinding and reacting raw material powder by a mechanical alloying method and successively applying heat treatment at 900° C. by a spark plasma sintering method is used.

FIG. 4 is a BF-STEM (Bright Field Scanning Transmission Electron Microscope) image obtained by observing a sintered body (Example 1), in which a charge composition ratio of Mn, Si, and Ge is Mn:Si:Ge=1.0:1.8:0.1, with a BF-STEM in a thermoelectric conversion material according to the present embodiment. As shown in FIG. 4, the thermoelectric conversion material of Example 1 comprises granular crystals several hundred nm in size. Further, in the BF-STEM image, an element of a large atomic weight (heavy element) is displayed dark and an element of a small atomic weight (light element) is displayed bright. By combining this with a result of EDX analysis (Energy Dispersive X-ray Spectrometry), it has been clarified that a bright visual field several hundred nm in size shown in FIG. 4 is $Mn(Si_{0.98}Ge_{0.02})_\gamma$ and a dark visual field is $Si_{0.5}Ge_{0.5}$. From his result, it is confirmed that the thermoelectric conversion material of Example 1 forms a composite material structure comprising $Mn(Si_{0.98}Ge_{0.02})_\gamma$ as the mother phase and $Si_{0.5}Ge_{0.5}$ as the additive phase.

Although it is not shown in the figure, as a result of measuring the thermal conductivity κ of the thermoelectric conversion material of Example 1, the thermal conductivity κ is almost constant of about 2.2 W/Km in the range from room temperature (about 25° C.) to about 600° C. In contrast, as a result of forming a sintered body (Comparative Example 1) comprising only $Mn(Si_{0.98}Ge_{0.02})_\gamma$, constituting the mother phase and measuring the thermal conductivity κ of the thermoelectric conversion material of Comparative Example 1, the thermal conductivity κ is about 2.5 to 4.0 W/Km in the range from room temperature (about 25° C.) to about 600° C.

It is considered that the thermal conductivity of Example 1 is smaller than that of Comparative Example 1 because of interface thermal resistance between a mother phase and an additive phase. Then the thermal conductivity of Example 1 does not change even when temperature is raised and that shows that the interface structure between the mother phase and the additive phase does not change even when temperature is raised. This shows that, even when a thermoelectric conversion material according the present embodiment having a configuration similar to Example 1 is used at a high temperature of about 600° C., it is possible to maintain thermoelectric performance.

Here, in a manufacturing method of the aforementioned thermoelectric conversion material, the heat treatment temperature is not limited to 900° C. and an optimum heat treatment temperature can be selected in accordance with a material and an organizational structure. Further, manufacturing methods of the thermoelectric conversion materials according to the example and the comparative example are not limited to the aforementioned methods and a bulk manufacturing method such as an arc melting method or a gas atomizing method may also be used, for example.

<Influence of Element Replacement>

In a thermoelectric conversion material according to the present embodiment, the influence of replacing an element constituting a mother phase or an additive phase with another element on a composition ratio γ and thermoelectric properties of the mother phase is explained hereunder.

Figure 5:
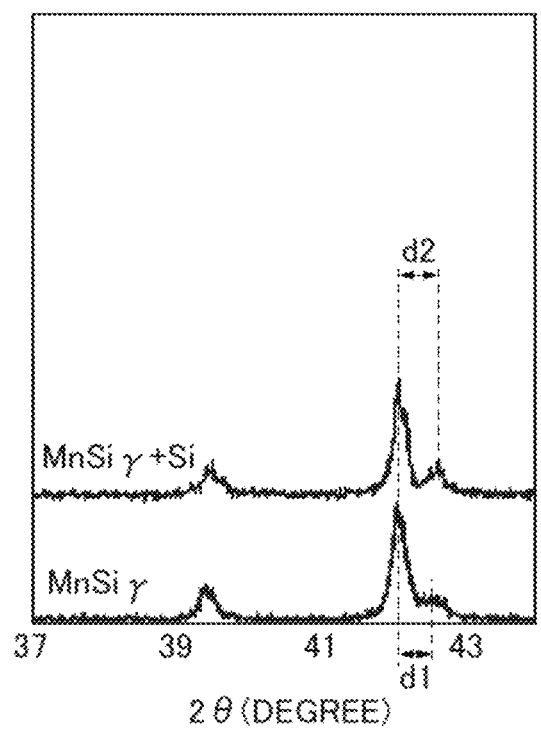
FIG. 5 is a graph showing results of crystal structure analysis of an $MnSi_\gamma$ single phase and a composite material structure comprising $MnSi_\gamma$ and Si by X-ray diffraction.
Figure 6:
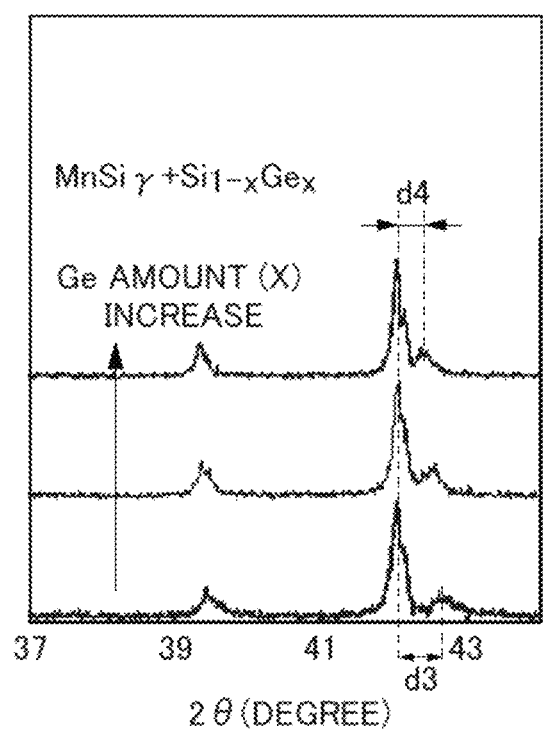
FIG. 6 is a graph showing results of crystal structure analysis of composite material structures comprising $MnSi_\gamma$ and $Si_{1-x}Ge_x$ by X-ray diffraction.
Figure 7:
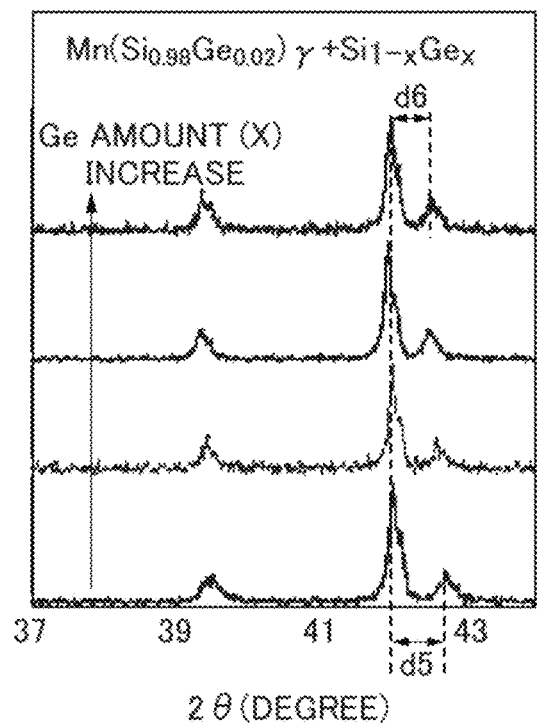
FIG. 7 is a graph showing results of crystal structure analysis of composite material structures comprising $Mn(Si_{0.98}Ge_{0.02})_\gamma$ and $Si_{1-x}Ge_x$ by X-ray diffraction.

FIG. 5 is a graph showing results of crystal structure analysis of an $MnSi_\gamma$ single phase and a composite material structure comprising $MnSi_\gamma$ and Si by X-ray diffraction. FIG. 6 is a graph showing results of crystal structure analysis of composite material structures comprising $MnSi_\gamma$ and $Si_{1-x}Ge_x$ by X-ray diffraction. FIG. 7 is a graph showing results of crystal structure analysis of composite material structures comprising $Mn(Si_{0.98}Ge_{0.02})_\gamma$ and $Si_{1-x}Ge_x$ by X-ray diffraction.

Figure 8:
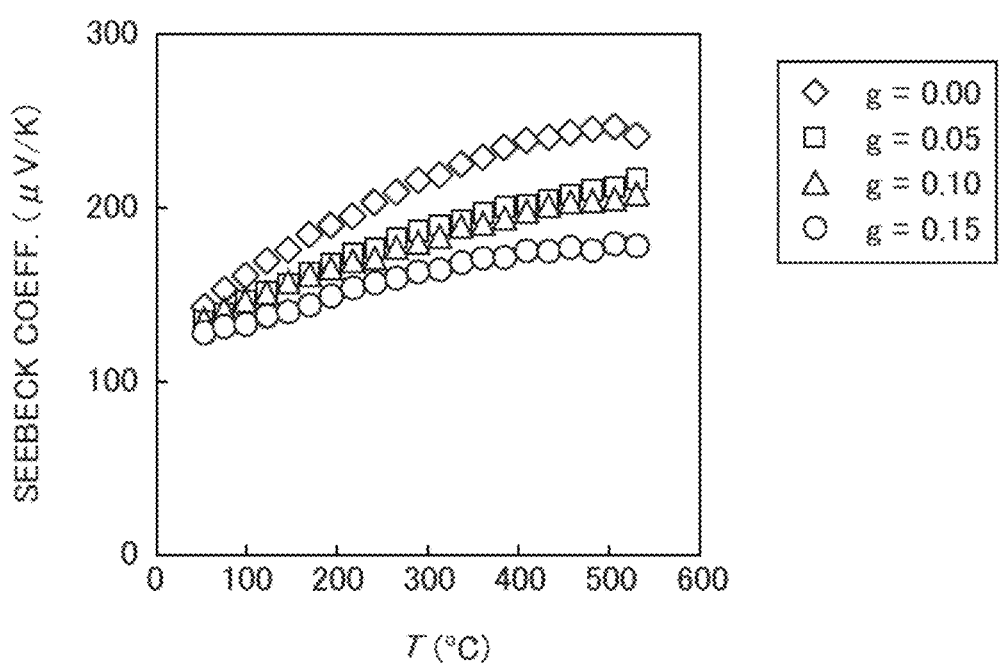
FIG. 8 is a graph showing temperature dependence of a Seebeck coefficient when Ge is added in a composite material structure comprising $MnSi_\gamma$ and Si.
Figure 9:
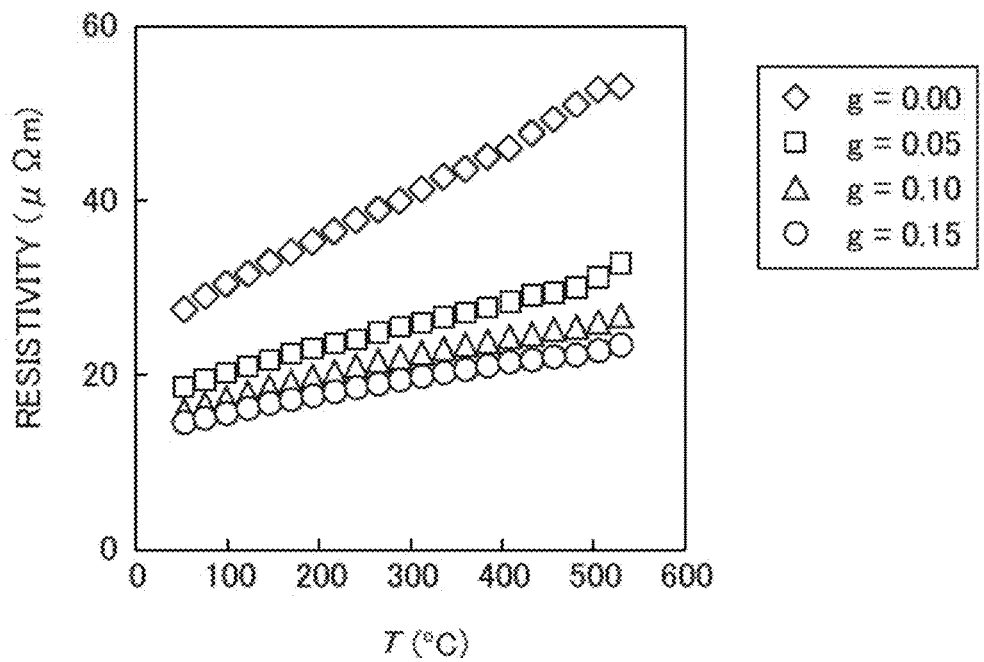
FIG. 9 is a graph showing temperature dependence of an electric resistivity when Ge is added in a composite material structure comprising $MnSi_\gamma$ and Si.
Figure 10:
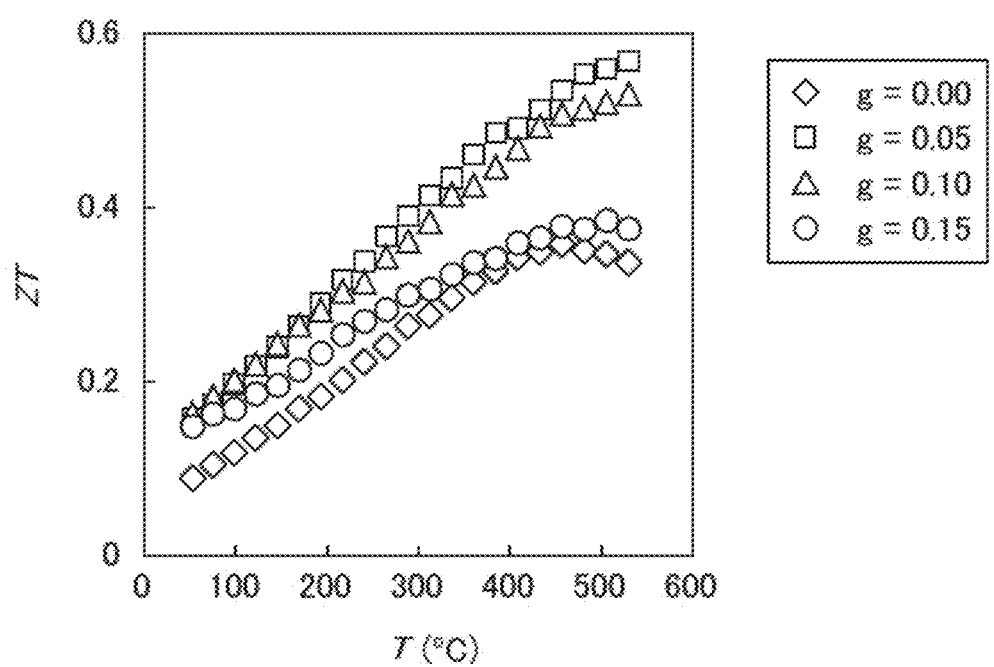
FIG. 10 is a graph showing temperature dependence of a dimensionless figure of merit when Ge is added in a composite material structure comprising $MnSi_\gamma$ and Si.

Further, FIG. 8 is a graph showing temperature dependence of a Seebeck coefficient S when Ge is added in a composite material structure comprising $MnSi_\gamma$ and Si. FIG. 9 is a graph showing temperature dependence of a specific resistance ρ when Ge is added in a composite material structure comprising $MnSi_\gamma$ and Si. FIG. 10 is a graph showing temperature dependence of a dimensionless figure of merit ZT when Ge is added in a composite material structure comprising $MnSi_\gamma$ and Si.

Figure 11:
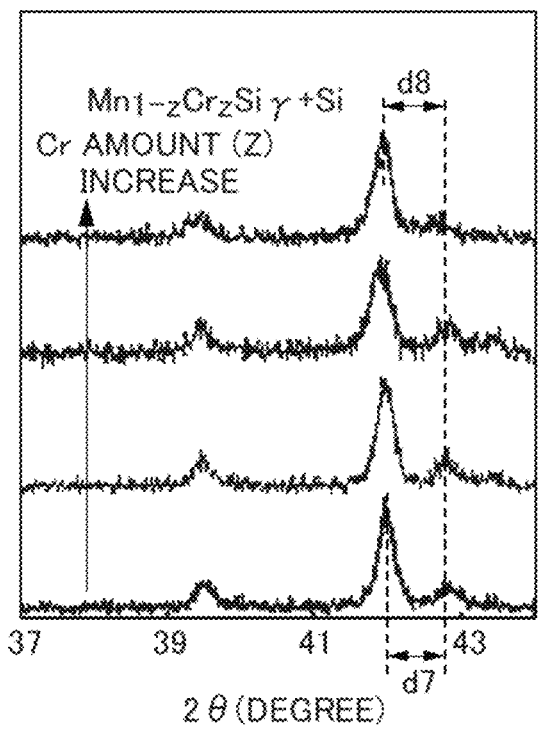
FIG. 11 is a graph showing results of crystal structure analysis of composite material structures comprising $Mn_{1-z}Cr_zSi_\gamma$ and Si by X-ray diffraction.
Figure 12:
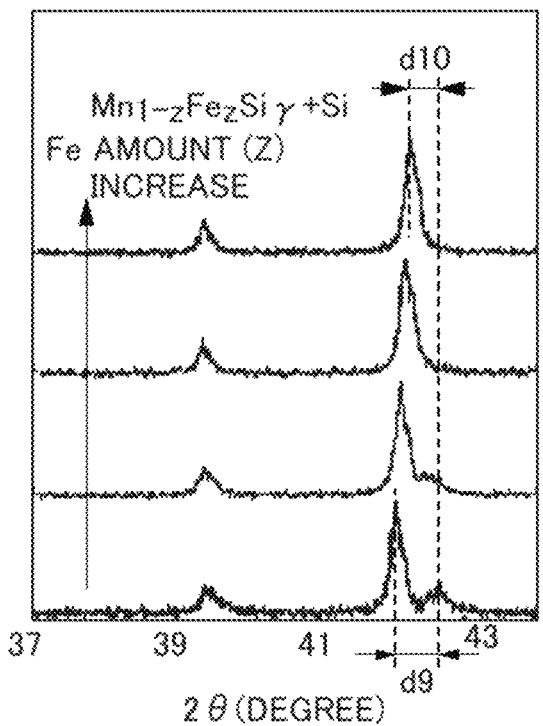
FIG. 12 is a graph showing results of crystal structure analysis of composite material structures comprising $Mn_{1-z}Fe_zSi_\gamma$ and Si by X-ray diffraction.

Further, FIG. 11 is a graph showing results of crystal structure analysis of composite material structures comprising $Mn_{1-z}Cr_zSi_\gamma$ and Si by X-ray diffraction. FIG. 12 is a graph showing results of crystal structure analysis of composite material structures comprising $Mn_{1-z}Fe_zSi_\gamma$ and Si by X-ray diffraction.

The sintered body comprising only $MnSi_\gamma$ and the sintered body comprising $MnSi_\gamma$ and Si shown in FIG. 5, the sintered bodies comprising $MnSi_\gamma$ and $Si_{1-x}Ge_x$ shown in FIG. 6, the sintered bodies comprising $Mn(Si_{0.98}Ge_{0.02})_\gamma$ and $Si_{1-x}Ge_x$ shown in FIG. 7, the sintered bodies comprising $Mn_{1-z}Cr_zSi_\gamma$ and Si shown in FIG. 11, and the sintered bodies comprising $Mn_{1-z}Fe_zSi_\gamma$ and Si shown in FIG. 12 are all manufactured by a manufacturing method similar to Example 1 stated earlier.

All the diffraction peaks in the vicinities where 2θ is 39.5°, 42.0°, and 42.5° shown in FIGS. 5 to 7, 11, and 12 are peaks derived from $MnSi_\gamma$. When the peak in the vicinity where 2θ is 42.0° is defined as a first peak and the peak in the vicinity where 2θ is 42.5° is defined as a second peak, the distance between the first peak and the second peak corresponds to a composition ratio γ in a chimney ladder type compound $MX_\gamma$. That is, a distance between a first peak and a second peak increases as a composition ratio γ increases and a distance between a first peak and a second peak reduces as a composition ratio γ reduces. Further, a position of a first peak corresponds to a lattice constant of an a axis or a b axis in a chimney ladder type compound $MX_\gamma$. That is, the first peak shifts toward the low angle side when the lattice constant of the a axis or the b axis in a chimney ladder type compound $MX_\gamma$ increases and the first peak shifts toward the high angle side when the lattice constant of the a axis or the b axis in a chimney ladder type compound $MX_\gamma$ reduces.

Based on the above, firstly a result of comparing a composition ratio γ of a single-phase structure comprising only a chimney ladder type compound $MX_\gamma$ and a composition ratio γ of a composite material structure of a mother phase comprising a chimney ladder type compound $MX_\gamma$ and an additive phase containing a second element X constituting the chimney ladder type compound $MX_\gamma$ is explained. Here, a composition ratio γ of a sintered body comprising only $MnSi_\gamma$ and a composition ratio γ of a sintered body of $MnSi_\gamma$ and Si (hereunder represented as a sintered body $MnSi_\gamma$+Si) are compared.

As shown in FIG. 5, when the sintered body comprising only $MnSi_\gamma$ (hereunder represented as a sintered body $MnSi_\gamma$) and the sintered body of $MnSi_\gamma$ and Si (hereunder represented as a sintered body $MnSi_\gamma$+Si) are compared, the positions of the first peaks are identical and hence it is obvious that the lattice constant of the a axis or the b axis in the chimney ladder type compound $MnSi_\gamma$ constituting the mother phase does not change with or without the additive phase Si. In contrast, the second peak shifts toward the high angle side by the existence of the additive phase Si. As a result, the distance d2 between the first peak and the second peak of the sintered body $MnSi_\gamma$+Si is larger than the distance d1 between the first peak and the second peak of the sintered body $MnSi_\gamma$.

From the above result shown in FIG. 5, it has been clarified that the composition ratio γ of the chimney ladder type compound $MnSi_\gamma$ constituting the mother phase increases by the existence of the additive phase Si. As stated earlier, a chimney ladder type compound $MnSi_\gamma$ takes a structure of arranging Si atoms of a spiral lattice in a square prism lattice comprising Mn atoms. When an additive phase Si exists, the amount of Si in the entire system increases and hence a part of Si in the additive phase is taken into the mother phase. As a result, it is estimated that, whereas the square prism lattice comprising Mn atoms does not change, the spiral lattice comprising the Si atoms shrinks and γ increases.

Successively, a relationship between a replacement amount and a composition ratio γ when an element constituting an additive phase is replaced with another element is explained. That is, in a composite material structure comprising $MX_y$ as a mother phase and $T_{1-x}X_x$ as an additive phase, the change of a composition ratio γ when the value of x is changed is explained. Here, sintered bodies of $MnSi_y$ and $Si_{1-x}Ge_x$ (hereunder represented as sintered bodies $MnSi_y+Si_{1-x}Ge_x$) are used.

In the sintered bodies $MnSi_y+Si_{1-x}Ge_x$ shown in FIG. 6, Si in an additive phase is replaced with up to 95% of Ge. That is, the maximum value of x in the additive phase $Si_{1-x}Ge_x$ is 0.95. A sintered body $MnSi_y+Si_{1-x}Ge_x$ having the smallest value of x (x=0) in an additive phase $Si_{1-x}Ge_x$ corresponds to the sintered body $MnSi_y+Si$ shown in FIG. 5.

As shown in FIG. 6, in the sintered bodies $MnSi_y+Si_{1-x}Ge_x$, even when the amount of Ge in an additive phase $Si_{1-x}Ge_x$ increases, the position of a first peak does not change and hence it is obvious that a lattice constant of an a axis or a b axis in a chimney ladder type compound $MnSi_y$ constituting a mother phase is constant regardless of the amount of Ge in the additive phase $Si_{1-x}Ge_x$. In contrast, as the amount of Ge in an additive phase $Si_{1-x}Ge_x$ increases, a second peak shifts toward the low angle side. That is, as the amount of Ge in the additive phase $Si_{1-x}Ge_x$ increases, the distance between the first peak and the second peak reduces. For example, in the sintered bodies $MnSi_y+Si_{1-x}Ge_x$, the distance d4 between the first peak and the second peak in the sintered body of the largest Ge amount is smaller than the distance d3 between the first peak and the second peak in the sintered body of the smallest Ge amount.

From the above result shown in FIG. 6, it has been clarified that the composition ratio γ of the chimney ladder type compound $MnSi_y$ constituting the mother phase reduces as the amount of Ge in the additive phase $Si_{1-x}Ge_x$ increases. As stated earlier, when an additive phase $Si_{1-x}Ge_x$ exists, the amount of Si in the entire system increases and hence a part of Si in the additive phase is taken into a mother phase. Since Ge in the additive phase forms a chemical compound with Si however, the amount of Si taken into the mother phase in the Si in the additive phase reduces relatively when the amount of Ge in the additive phase $Si_{1-x}Ge_x$ increases.

Further, when the amount of Ge in an additive phase $Si_{1-x}Ge_x$ increases further, Si in the additive phase is not taken into a mother phase and inversely Si in the $MnSi_y$ constituting the mother phase is taken into the additive phase and produces a chemical compound with Ge in the additive phase. As a result, it is considered that the amount of Si in the mother phase $MnSi_y$ reduces, a square prism lattice comprising Mn atoms does not change, but a spiral lattice comprising Si atoms expands, and γ reduces.

This is compatible with the result that the distance d4 between the first peak and the second peak of the sintered body of the largest Ge amount in the sintered bodies $MnSi_y+Si_{1-x}Ge_x$ shown in FIG. 6 is smaller than the distance d2 between the first peak and the second peak of the sintered body $MnSi_y$ not having an additive phase Si shown in FIG. 5. That is, this is compatible with the fact that the composition ratio γ of the sintered body of the largest Ge amount in the sintered bodies $MnSi_y+Si_{1-x}Ge_x$ shown in FIG. 6, regardless of containing Si in the additive phase, is smaller than the composition ratio γ of the sintered body not having the additive phase Si (not containing Si in the additive phase) shown in FIG. 5.

Meanwhile, since Si and Ge have the same valence, it is estimated that the carrier density of a sintered body does not change even when the amount of Ge in an additive phase $Si_{1-x}Ge_x$ is changed. As stated earlier however, since γ is a composition ratio of Si to Mn in a mother phase, the carrier density of the sintered body increases as γ reduces. $MnSi_y$ becomes an intrinsic semiconductor at γ=1.75 and a p-type semiconductor at γ<1.75.

Successively, a relationship between a replacement amount in an additive phase and a composition ratio γ when an element constituting a mother phase is replaced with another element and an element constituting the additive phase is replaced with another element is explained. Here, as a replaced element, an element Y with which a second element X constituting a mother phase $MX_y$ is replaced is introduced. That is, in a composite material structure comprising $M(X_{1-y}Y_y)_y$ as a mother phase and $T_{1-x}X_x$ as an additive phase, the change of a composition ratio γ when the value of x changes is explained. Here, sintered bodies of $Mn(Si_{0.98}Ge_{0.02})_y$ and $Si_{1-x}Ge_x$ (hereunder represented as sintered bodies $Mn(Si_{0.98}Ge_{0.02})_y+Si_{1-x}Ge_x$) are used.

In the sintered bodies $Mn(Si_{0.98}Ge_{0.02})_y+Si_{1-x}Ge_x$ shown in FIG. 7, Si in an additive phase is replaced with up to 60% of Ge. That is, the maximum value of x in the additive phase $Si_{1-x}Ge_x$ is 0.60.

As shown in FIG. 7, in the sintered bodies $Mn(Si_{0.98}Ge_{0.02})_y+Si_{1-x}Ge_x$, the position of a first peak shifts toward the low angle side as the amount of Ge in an additive phase $Si_{1-x}Ge_x$ increases. This shows that a lattice constant of an a axis or a b axis in a chimney ladder type compound $Mn(Si_{0.98}Ge_{0.02})_y$ constituting a mother phase increases. That is, this means that, when Si constituting a mother phase $MnSi_y$ is replaced with Ge in advance, Ge is taken into the mother phase as the amount of Ge in an additive phase increases. Originally it has been known that a solid solution amount of Ge in a chimney ladder type compound $MnSi_y$ is about 2 at % (namely $Mn(Si_{0.98}Ge_{0.02})_y$) but it is estimated that, as Ge is taken into the mother phase, Si in the mother phase is further replaced with Ge and the crystal structure of the mother phase changes.

In contrast, a second peak shifts toward the low angle side as the amount of Ge in an additive phase $Si_{1-x}Ge_x$ increases. As it has been explained in FIG. 6, this is thought to be because Ge in the additive phase produces a chemical compound with Si in $Mn(Si_{1-y}Ge_y)_y$ constituting a mother phase and the amount of Si in the mother phase $Mn(Si_{1-y}Ge_y)_y$ reduces relatively.

Meanwhile, the shift amount of the second peak is larger than the shift amount of the first peak stated earlier. That is, the distance between the first peak and the second peak reduces as the amount of Ge in the additive phase $Si_{1-x}Ge_x$ increases. For example, in the sintered bodies $Mn(Si_{0.98}Ge_{0.02})_y+Si_{1-x}Ge_x$, the distance d6 between the first peak and the second peak in the sintered body of the largest Ge amount is smaller than the distance d5 between the first peak and the second peak in the sintered body of the smallest Ge amount.

From the above, it is obvious that the composition ratio γ of a chimney ladder type compound $MnSi_y$ constituting a mother phase changes when a second element (Si) constituting the mother phase is replaced with another element (Ge). Then it is obvious that, when an additive phase comprises the second element (Si) and a fifth element (Ge) forming a chemical compound with the second element (Si)

and the amount of the fifth element (Ge) in the additive phase changes, the composition ratio γ of the chimney ladder type compound $MnSi_\gamma$ constituting the mother phase changes.

Here, in a thermoelectric conversion material according to the present embodiment, relationships between an element replacement ratio and properties of the thermoelectric conversion material when an element constituting a mother phase and an additive phase is replaced with another element are explained in reference to FIGS. 8 to 10.

The graphs shown in FIGS. 8 to 10 represent physical property values measured by changing the amount of added Ge in the sintered bodies $Mn(Si_{0.98}Ge_{0.02})_\gamma + Si_{1-x}Ge_x$ shown in FIG. 7. Specifically, in thermoelectric conversion materials according to the present embodiment, the curves correspond to the cases of changing g to 0.00, 0.05, 0.10, and 0.15 in sintered bodies having a charged composition ratio of Mn, Si, and Ge represented by the expression Mn:Si:Ge=1.0:1.9−g:g. That is, in those sintered bodies, the amount of Ge in the additive phase increases as g increases. The cases therefore are shown in FIG. 7.

As shown in FIG. 8, a Seebeck coefficient S reduces as the amount of Ge in an additive phase increases. Further, as shown in FIG. 9, a specific resistance ρ reduces as the amount of Ge in an additive phase increases. From those results, an output factor $S^2/\rho$ takes a maximum value when g=0.10 in the present embodiment although it is not shown in the figures.

Successively, a relationship between a replacement amount in an additive phase and a composition ratio γ when an element constituting a mother phase is replaced with another element and an element constituting the additive phase is replaced with another element is explained. Unlike the above, here, as a replaced element, an element Z with which a first element M constituting a mother phase $MX_\gamma$ is replaced is introduced. That is, in a composite material structure comprising $M_{1-z}Z_zX_\gamma$ as a mother phase and X as an additive phase, the change of a composition ratio γ when the value of z is changed is explained. Here, sintered bodies of $Mn_{1-z}Cr_zSi_\gamma$ and Si (hereunder represented as sintered bodies $Mn_{1-z}Cr_zSi_\gamma+Si$) and sintered bodies of $Mn_{1-z}Fe_zSi_\gamma$ and Si (hereunder represented as sintered bodies $Mn_{1-z}Fe_zSi_\gamma+Si$) are used.

In the sintered bodies $Mn_{1-z}Cr_zSi_\gamma+Si$ shown in FIG. 11, Mn in a mother phase is replaced with up to 20% of Cr. That is, the maximum value of z in the mother phase $Mn_{1-z}Cr_zSi_\gamma$ is 0.20. Likewise, in the sintered bodies $Mn_{1-z}Fe_zSi_\gamma+Si$ shown in FIG. 12, Mn in a mother phase is replaced with up to 20% of Fe. That is, the maximum value of z in the mother phase $Mn_{1-z}Fe_zSi_\gamma$ is 0.20.

As shown in FIG. 11, in the sintered bodies $Mn_{1-z}Cr_zSi_\gamma+Si$, the position of a first peak shifts toward the low angle side as the amount of Cr in a mother phase $Mn_{1-z}Cr_zSi_\gamma$ increases. This shows that a lattice constant of an a axis or a b axis in a chimney ladder type compound $Mn_{1-z}Cr_zSi_\gamma$ constituting the mother phase increases. That is, it is estimated that, in a square prism lattice comprising Mn atoms constituting the mother phase, the crystal structure of the mother phase changes as Mn is replaced with Cr.

In contrast, because the positions of the second peaks are identical, a spiral lattice comprising Si atoms is thought not to have changed. That is, the distance between the first peak and the second peak increases as the amount of Cr in the mother phase $Mn_{1-z}Cr_zSi_\gamma$ increases. For example, in the sintered bodies $Mn_{1-z}Cr_zSi_\gamma+Si$, the distance d8 between the first peak and the second peak of the sintered body of the largest Cr amount is larger than the distance d7 between the first peak and the second peak of the sintered body of the smallest Cr amount.

Further, as shown in FIG. 12, in sintered bodies $Mn_{1-z}Fe_zSi_\gamma+Si$, the position of a first peak shifts toward the high angle side as the amount of Fe in a mother phase $Mn_{1-z}Fe_zSi_\gamma$ increases. This shows that a lattice constant of an a axis or a b axis in a chimney ladder type compound $Mn_{1-z}Fe_zSi_\gamma$ constituting the mother phase reduces. That is, it is estimated that, in a square prism lattice comprising Mn atoms constituting the mother phase, the crystal structure of the mother phase changes as Mn is replaced with Fe.

In contrast, because the positions of the second peaks are identical, a spiral lattice comprising Si atoms is thought not to have changed. That is, the distance between the first peak and the second peak increases as the amount of Fe in the mother phase $Mn_{1-z}Fe_zSi_\gamma$ increases. For example, in the sintered bodies $Mn_{1-z}Fe_zSi_\gamma+Si$, the distance d10 between the first peak and the second peak of the sintered body of the largest Fe amount is smaller than the distance d9 between the first peak and the second peak of the sintered body of the smallest Fe amount.

From the above, it is obvious that the composition ratio γ of a chimney ladder type compound $MnSi_\gamma$ constituting a mother phase changes when a first element (Mn) constituting the mother phase is replaced with another element (Cr or Fe).

Main Features and Effects in Present Embodiment

One of the main features of a thermoelectric conversion material 101 according to the present embodiment is that the thermoelectric conversion material 101 contains a mother phase 102 comprising a chimney ladder type compound $MX_\gamma$ (for example, $MnSi_\gamma$) and an additive phase 103 existing at a grain boundary of the mother phase 102 as shown in FIG. 3. Then the mother phase 102 contains a third element to change the lattice constant of the chimney ladder type compound $MX_\gamma$. That is, the mother phase 102 contains: an element Y (for example, Ge) with which a part of a second element X (for example, Si) in the chimney ladder type compound is replaced; or an element Z (for example, Cr or Fe) with which a part of a first element M (for example, Mn) in the chimney ladder type compound constituting the mother phase 102 is replaced. Further, the additive phase 103 contains an element T (for example, Ge) and the second element X. The element T is an element that forms a chemical compound with the second element X.

As stated earlier, because the mother phase 102 contains the element Y, a part of the second element X in the chimney ladder type compound $MX_\gamma$ constituting the mother phase 102 is replaced with the element Y. The lattice constant of the chimney ladder type compound $M(X_{1-y}Y_y)_\gamma$ after replaced therefore takes a value different from the lattice constant of the chimney ladder type compound $MX_\gamma$ before replaced. As a result, a composition ratio γ in the chimney ladder type compound $MX_\gamma$ changes.

Likewise, because the mother phase 102 contains the element Z, a part of the first element M in the chimney ladder type compound $MX_\gamma$ constituting the mother phase 102 is replaced with the element Z. The lattice constant of the chimney ladder type compound $M_{1-z}Z_zX_\gamma$ after replaced therefore takes a value different from the lattice constant of the chimney ladder type compound $MX_\gamma$ before replaced. As a result, a composition ratio γ in the chimney ladder type compound $MX_\gamma$ changes.

Meanwhile, because the additive phase 103 contains the second element X, the amount of the second element X in the chimney ladder type compound $MX_\gamma$ constituting the mother phase 102 changes relatively. More specifically, because the additive phase 103 contains the element T, a part of the second element X in the chimney ladder type compound $MX_\gamma$ constituting the mother phase 102 forms a chemical compound with the element T in the additive phase 103 and the amount of the second element X in the chimney ladder type compound $MX_\gamma$ constituting the mother phase 102 reduces relatively. As a result, a composition ratio $\gamma$ in the chimney ladder type compound $MX_\gamma$ reduces.

From the above, in a thermoelectric conversion material according to the present embodiment, by adding elements to both a mother phase and an additive phase, it is possible to adjust a composition ratio $\gamma$ of a chimney ladder type compound $MX_\gamma$ constituting the mother phase to a desired value. That is, when a first element M (for example, Mn) or a second element X (for example, Si) in a chimney ladder type compound $MX_\gamma$ constituting a mother phase is replaced with another element (for example, Ge, Cr, or Fe), by adjusting the amount of the second element X in an additive phase by an element T (for example, Ge), it is possible to adjust a composition ratio $\gamma$ to a desired value. As a result, in a thermoelectric conversion material containing a mother phase of a chimney ladder type compound according to the present embodiment, when element replacement is carried out with the aim of optimizing a carrier density and reducing $\kappa_{ph}$, a composition ratio $\gamma$ can be controlled easily. Then by controlling a composition ratio $\gamma$, it is possible to optimize the carrier density in the thermoelectric conversion material and maximize an output factor $S^2/\rho$.

Further, in a thermoelectric conversion material 101 according to the present embodiment, a composite material structure of a mother phase and an additive phase is adopted. By interface thermal resistance between the mother phase and the additive phase therefore, it is possible to reduce a thermal conductivity $\kappa_{ph}$ by a lattice.

In the present embodiment in particular, a mother phase 102 and an additive phase 103 do not form a chemical compound by any reaction of eutectic reaction, eutectoid reaction, peritectic reaction, peritectoid reaction, monotectic reaction, or segregation reaction, and exist in the states of separating from each other. Even when the temperature of a thermoelectric conversion material rises therefore, the interface structure of the mother phase 102 and the additive phase 103 never collapses. As a result, the thermoelectric conversion material according to the present embodiment can maintain thermoelectric performance even when it is used at a high temperature.

Meanwhile, as stated earlier, $\kappa_{ph}$ does not depend on a carrier density. Further, it has been known that a composition ratio $\gamma$ does not change even when the ratio of a mother phase $MX_\gamma$ and an additive phase $X_{1-x}T_x$ in a sintered body $MX_\gamma + X_{1-x}T_x$ and the crystal grain sizes of the mother phase and the additive phase are changed. By dispersing an additive phase at a grain boundary of a mother phase and the like therefore, it is possible to reduce $\kappa_{ph}$ effectively.

Further, as shown in FIGS. 1 and 2, in a thermoelectric conversion module 10 according to the present embodiment, a thermoelectric conversion material 101 according to the present embodiment shown in FIG. 3 can be adopted as a p-type thermoelectric conversion material 14 and hence it is possible to improve the performance of the thermoelectric conversion module 10.

Meanwhile, although the present embodiment has been explained on the basis of the case where an additive phase 103 exists at a grain boundary of a mother phase 102, the present invention is not limited to the case and an additive phase 103 may exist at a place other than a grain boundary of a mother phase 102. That is, a mother phase 102 may contain a chimney ladder type compound $MX_\gamma$ and an additive phase 103. An additive phase 103 however exists at least at a grain boundary of a mother phase 102 without fail.

Meanwhile, an element defect may exist in a chimney ladder type compound constituting a mother phase 102. Further, a plurality of chimney ladder type compounds may be combined. Furthermore, in a mother phase 102 and an additive phase 103, a part of a constituent element may be replaced with an element other than the third element, the fourth element, and the fifth element, those being stated earlier.

In addition, although it is not shown in the figures, in a thermoelectric conversion material according to the present embodiment, in addition to a mother phase and an additive phase stated earlier, a second additive phase may exist at a grain boundary and the like of the mother phase. By forming the second additive phase, it is possible to further reduce a thermal conductivity $\kappa_{ph}$ by a lattice of a thermoelectric conversion material. Here, when the second additive phase comprises a metal for example, the resistivity of the second additive phase is smaller than the resistivities of the mother phase and the additive phase and hence there is an advantage that a specific resistance $\rho$ of a thermoelectric conversion material hardly increases. In contrast, when the second additive phase comprises a semiconductor or an insulator for example, there is an advantage that a thermal conductivity $\kappa_{ph}$ by a lattice can be reduced further than when the second additive phase comprises a metal. That is, from the viewpoint of reducing both a thermal conductivity $\kappa_{ph}$ by a lattice and a specific resistance $\rho$, it is advantageous that the second additive phase comprises a metal than that the second additive phase comprises a semiconductor or an insulator. In contrast, from the viewpoint of reducing a thermal conductivity $\kappa_{ph}$ by a lattice as much as possible, it is advantageous that the second additive phase comprises a semiconductor or an insulator than that the second additive phase comprises a metal.

Modified Example 1

Figure 13:
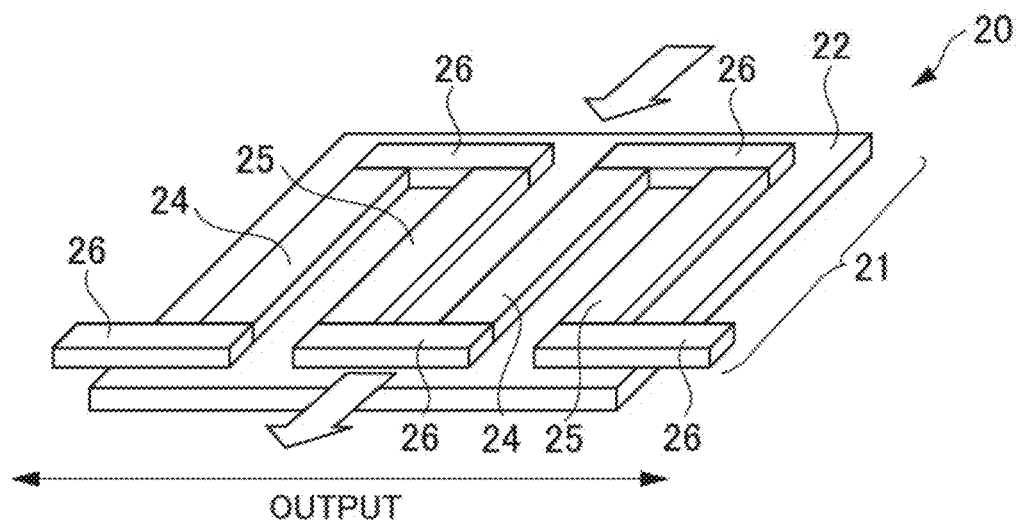
FIG. 13 is a schematic perspective view showing a substantial part of a thermoelectric conversion module according to a first modified example.
Figure 14:
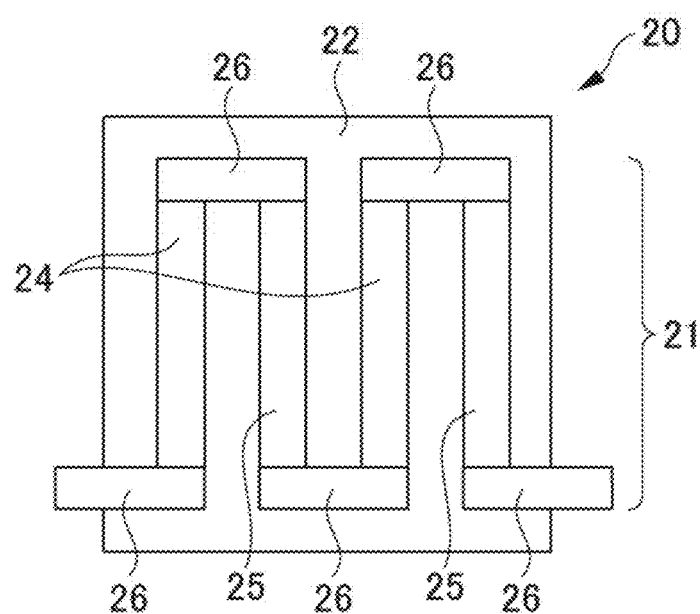
FIG. 14 is a schematic plan view showing a substantial part of the thermoelectric conversion module shown in FIG. 13.

A thermoelectric conversion module according to a first modified example (hereunder Modified Example 1) of the aforementioned embodiment is explained hereunder in reference to FIGS. 13 and 14. FIG. 13 is a schematic perspective view showing a substantial part of a thermoelectric conversion module according to Modified Example 1. FIG. 14 is a schematic plan view showing a substantial part of the thermoelectric conversion module shown in FIG. 13.

As shown in FIGS. 13 and 14, a thermoelectric conversion module 20 according to Modified Example 1 has a thermoelectric conversion section 21 and a lower substrate 22. The thermoelectric conversion section 21 is formed above the lower substrate 22. The thermoelectric conversion section 21 comprises a plurality of p-type thermoelectric conversion materials 24, a plurality of n-type thermoelectric conversion materials 25, and a plurality of electrodes 26. The p-type thermoelectric conversion materials 24 and the n-type thermoelectric conversion materials 25 are connected alternately with the electrodes 26 interposed. The lower substrate 22 comprises a sapphire substrate for example. The p-type thermoelectric conversion materials 24 and the n-type thermoelectric conversion materials 25 are obtained by being formed into a thin film over the lower substrate 22 by a magnetron sputtering method and being subjected to heat treatment at about 800° C., for example. Here, the p-type thermoelectric conversion materials 24 and the n-type thermoelectric conversion materials 25 may be formed by a thin film forming method such as an MBE (Molecular Beam Epitaxy) method, a PLD (Pulse Laser Deposition) method, or a CVD (Chemical Vapor Deposition) method.

As shown in FIG. 13, in the thermoelectric conversion module 20, when a temperature difference is given in an in-plane direction (direction of the arrow in FIG. 13), voltages are generated in the p-type thermoelectric conversion materials 24 and the n-type thermoelectric conversion materials 25 contained in the thermoelectric conversion section 21 respectively by Seebeck effect. By the thermoelectric conversion module 20 therefore, it is possible to: take out the voltages generated in the p-type thermoelectric conversion materials 24 and the n-type thermoelectric conversion materials 25 to the exterior through the electrodes 26; and thus convert heat into electric energy.

As the p-type thermoelectric conversion material 24 in the thermoelectric conversion module 20 according to Modified Example 1 shown in FIGS. 13 and 14, the thermoelectric conversion material 101 according to the aforementioned embodiment shown in FIG. 3 can be adopted. Further, the n-type thermoelectric conversion material 25 in the thermoelectric conversion module 20 according to Modified Example 1 shown in FIGS. 13 and 14 can comprise $Mg_2Si$ for example.

The thermoelectric conversion section 21 according to Modified Example 1: is a a $\pi$ type similarly to the thermoelectric conversion section 11 according to the aforementioned embodiment shown in FIGS. 1 and 2; but is different from the thermoelectric conversion section 11 according to the aforementioned embodiment on the point that it is formed into a thin film. Also in the thermoelectric conversion module 20 according to Modified Example 1, the thermoelectric conversion material 101 according to the aforementioned embodiment shown in FIG. 3 can be adopted as the p-type thermoelectric conversion material 24 similarly to the thermoelectric conversion module 10 according to the aforementioned embodiment and hence it is possible to improve the performance of the thermoelectric conversion module 20.

Meanwhile, also in the p-type thermoelectric conversion material 24 according to Modified Example 1, a mother phase 102 and an additive phase 103: do not form a chemical compound by any reaction of eutectic reaction, eutectoid reaction, peritectic reaction, peritectoid reaction, monotectic reaction, or segregation reaction; and exist in the states of separating from each other. The heat treatment temperature of the thermoelectric conversion material 101 constituting the p-type thermoelectric conversion material 24 therefore is not limited to 800° C. and a heat treatment temperature that can maximize thermoelectric performance in conformity with a constituent element and an organizational structure can be selected.

Modified Example 2

Figure 15:
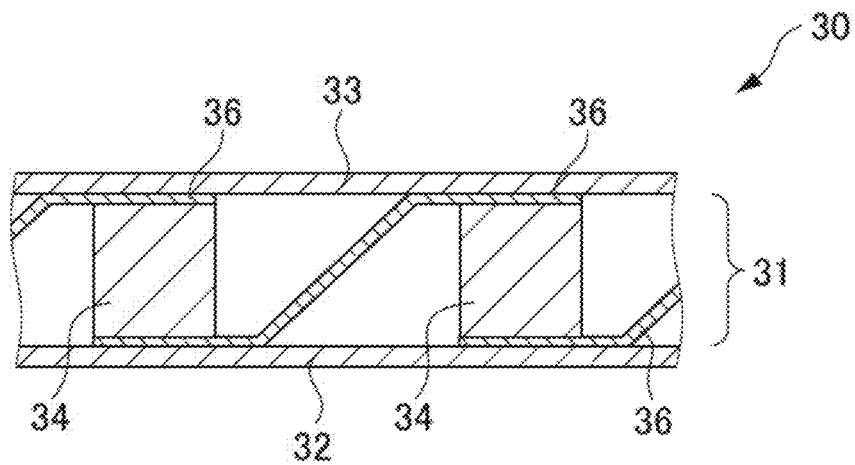
FIG. 15 is a schematic sectional view showing a substantial part of a thermoelectric conversion module according to a second modified example.

A thermoelectric conversion module according to a second modified example (hereunder Modified Example 2) of the aforementioned embodiment is explained hereunder in reference to FIG. 15. FIG. 15 is a schematic sectional view showing a substantial part of a thermoelectric conversion module according to Modified Example 2.

As shown in FIG. 15, a thermoelectric conversion module 30 according to Modified Example 2 has a thermoelectric conversion section 31, a lower substrate 32, and an upper substrate 33. The thermoelectric conversion section 31 is interposed between the lower substrate 32 and the upper substrate 33. The thermoelectric conversion section 31 comprises a plurality of p-type thermoelectric conversion materials 34 and a plurality of electrodes 36. The p-type thermoelectric conversion materials 34 are connected alternately with the electrodes 36 interposed. As the p-type thermoelectric conversion materials 34 in the thermoelectric conversion module 30 according to Modified Example 2, the thermoelectric conversion material 101 according to the aforementioned embodiment shown in FIG. 3 can be adopted. Here, an n-type thermoelectric conversion material may be used instead of a p-type thermoelectric conversion material 34.

In the thermoelectric conversion module 30, when a temperature difference is given between the lower substrate 32 and the upper substrate 33, voltages are generated in the p-type thermoelectric conversion materials 34 contained in the thermoelectric conversion section 31 by Seebeck effect. By the thermoelectric conversion module 30 therefore, it is possible to: take out the voltages generated in the p-type thermoelectric conversion materials 34 to the exterior through the electrodes 36; and thus convert heat into electric energy.

The thermoelectric conversion section 31 according to Modified Example 2 is different from the thermoelectric conversion section 11 according to the aforementioned embodiment on the point that the thermoelectric conversion section 31 is a uni-leg type, in other words, comprises only either p-type thermoelectric conversion materials or n-type thermoelectric conversion materials. Also in the thermoelectric conversion module 30 according to Modified Example 2, the thermoelectric conversion material 101 according to the aforementioned embodiment shown in FIG. 3 can be adopted as the p-type thermoelectric conversion materials 34 similarly to the thermoelectric conversion module 10 according to the aforementioned embodiment and hence it is possible to improve the performance of the thermoelectric conversion module 30.

Modified Example 3

Figure 16:
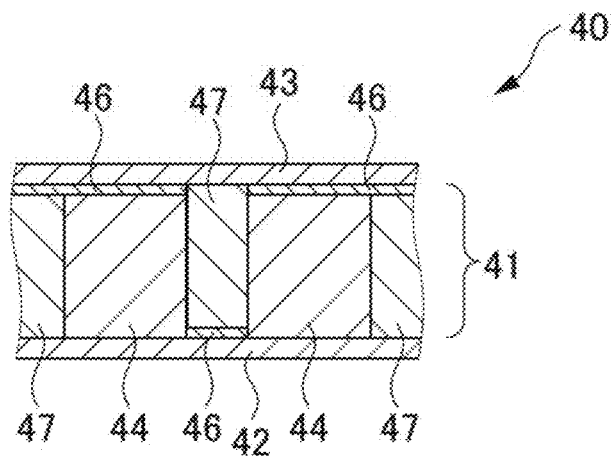
FIG. 16 is a schematic sectional view showing a substantial part of a thermoelectric conversion module according to a third modified example.

A thermoelectric conversion module according to a third modified example (hereunder Modified Example 3) of the aforementioned embodiment is explained hereunder in reference to FIG. 16. FIG. 16 is a schematic sectional view showing a substantial part of a thermoelectric conversion module according to Modified Example 3.

As shown in FIG. 16, a thermoelectric conversion module 40 according to Modified Example 3 has a thermoelectric conversion section 41, a lower substrate 42, and an upper substrate 43. The thermoelectric conversion section 41 is interposed between the lower substrate 42 and the upper substrate 43. The thermoelectric conversion section 41 comprises a plurality of p-type thermoelectric conversion materials 44 and a plurality of electrodes 46. The p-type thermoelectric conversion materials 44 are connected alternately with the electrodes 46 interposed. The multiple p-type thermoelectric conversion materials 44 are lined up with insulating films 47 interposed. As the p-type thermoelectric conversion materials 44 in the thermoelectric conversion module 40 according to Modified Example 3, the thermoelectric conversion material 101 according to the aforementioned embodiment shown in FIG. 3 can be adopted. Here, an n-type thermoelectric conversion material may be used instead of a p-type thermoelectric conversion material 44.

In the thermoelectric conversion module 40, when a temperature difference is given between the lower substrate 42 and the upper substrate 43, voltages are generated in the p-type thermoelectric conversion materials 44 contained in the thermoelectric conversion section 41 by Seebeck effect. By the thermoelectric conversion module 40 therefore, it is possible to: take out the voltages generated in the p-type thermoelectric conversion materials 44 to the exterior through the electrodes 46; and thus convert heat into electric energy.

The thermoelectric conversion section 41 according to Modified Example 3 is a uni-leg type similarly to the thermoelectric conversion section 31 according to Modified Example 2 shown in FIG. 15 but is different from the thermoelectric conversion section 31 according to Modified Example 2 on the point that the thermoelectric conversion section 41 is formed in the shape of a thin film. Also in the thermoelectric conversion module 40 according to Modified Example 3, the thermoelectric conversion material 101 according to the aforementioned embodiment shown in FIG. 3 can be adopted as the p-type thermoelectric conversion materials 44 similarly to the thermoelectric conversion module 10 according to the aforementioned embodiment and hence it is possible to improve the performance of the thermoelectric conversion module 40.

Modified Example 4

Figure 17:
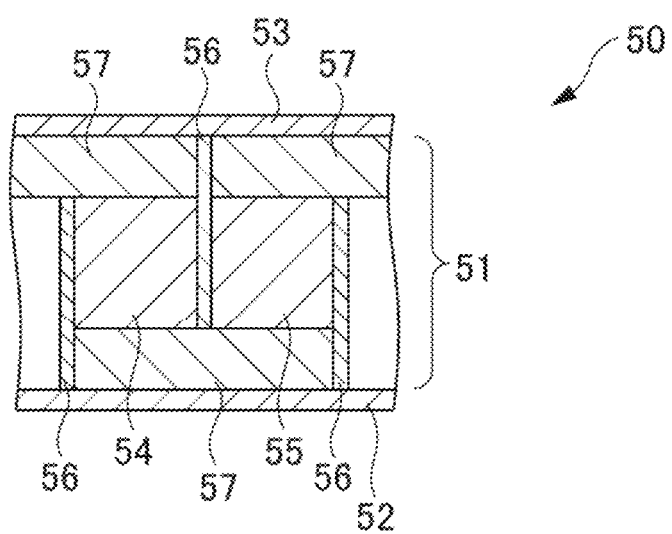
FIG. 17 is a schematic sectional view showing a substantial part of a thermoelectric conversion module according to a fourth modified example.

A thermoelectric conversion module according to a fourth modified example (hereunder Modified Example 4) of the aforementioned embodiment is explained hereunder in reference to FIG. 17. FIG. 17 is a schematic sectional view showing a substantial part of a thermoelectric conversion module according to Modified Example 4.

As shown in FIG. 17, a thermoelectric conversion module 50 according to Modified Example 4 has a thermoelectric conversion section 51, a lower substrate 52, and an upper substrate 53. The thermoelectric conversion section 51 is interposed between the lower substrate 52 and the upper substrate 53. The thermoelectric conversion section 51 comprises a plurality of p-type thermoelectric conversion materials 54, a plurality of n-type thermoelectric conversion materials 55, and a plurality of electrodes 56. The p-type thermoelectric conversion materials 54 and the n-type thermoelectric conversion materials 55 are connected alternately with the electrodes 56 interposed. Insulating films 57 are arranged between the lower substrate 52 and the p-type thermoelectric conversion materials 54 and the n-type thermoelectric conversion materials 55 and between the upper substrate 53 and the p-type thermoelectric conversion materials 54 and the n-type thermoelectric conversion materials 55.

In the thermoelectric conversion module 50, when a temperature difference is given between the lower substrate 52 and the upper substrate 53, voltages are generated in the p-type thermoelectric conversion materials 54 and the n-type thermoelectric conversion materials 55 contained in the thermoelectric conversion section 51 respectively by Seebeck effect. By the thermoelectric conversion module 50 therefore, it is possible to: take out the voltages generated in the p-type thermoelectric conversion materials 54 and the n-type thermoelectric conversion materials 55 to the exterior through the electrodes 56; and thus convert heat into electric energy.

The thermoelectric conversion material 101 according to the aforementioned embodiment shown in FIG. 3 can be adopted as the p-type thermoelectric conversion materials 54 in the thermoelectric conversion module 50 according to Modified Example 4. Further, the n-type thermoelectric conversion materials 55 in the thermoelectric conversion module 50 according to Modified Example 4 shown in FIG. 17 can comprise $Mg_2Si$ for example.

The thermoelectric conversion section 51 according to Modified Example 4 is different from the thermoelectric conversion section 11 according to the aforementioned embodiment on the point that the thermoelectric conversion section 51 is a transverse type, in other words the direction where the p-type thermoelectric conversion materials and the n-type thermoelectric conversion materials are connected is rotated 90° in comparison with a π type (refer to the thermoelectric conversion section 11 in FIG. 2). Also in the thermoelectric conversion module 50 according to Modified Example 4, the thermoelectric conversion material 101 according to the aforementioned embodiment shown in FIG. 3 can be adopted as the p-type thermoelectric conversion materials 54 similarly to the thermoelectric conversion module 10 according to the aforementioned embodiment and hence it is possible to improve the performance of the thermoelectric conversion module 50.

Although the invention made by the present inventors has heretofore been explained specifically on the basis of the embodiments, it goes without saying that the present invention is not limited to the aforementioned embodiments and can be modified variously within the scope not departing from the tenor of the present invention.

What is claimed is:

1. A thermoelectric conversion material comprising: a mother phase containing a chimney ladder type compound comprising a first element of groups 4 to 9 and a second element of groups 13 to 15; and an additive phase existing at a grain boundary of the mother phase, wherein:

the chimney ladder type compound contains a third element and has a different lattice constant than the chimney ladder type compound in a mother phase which does not contain the third element; the chimney ladder type compound contains a fourth element, different than the third element, and has a different lattice constant than the chimney ladder type compound in a mother phase which does not contain the fourth element; wherein the third element changes a composition ratio of the second element to the first element in the chimney ladder type compound by replacing part of the second element with the third element; wherein the fourth element changes a composition ratio of the first element to the second element by replacing part of the first element with the fourth element; wherein the additive phase contains the second element, an atomic weight of the third element is larger than an atomic weight of the second element.

2. The thermoelectric conversion material according to claim 1, wherein the mother phase and the additive phase: do not form a chemical compound by any reaction of eutectic reaction, eutectoid reaction, peritectic reaction, peritectoid reaction, monotectic reaction, or segregation reaction; and exist in separate states from each other.

3. The thermoelectric conversion material according to claim 1, wherein the additive phase contains a fifth element to form a chemical compound with the second element.

4. The thermoelectric conversion material according to claim 3, wherein the fifth element is Ge or Sn.

5. The thermoelectric conversion material according to claim 1, wherein the third element is Ge or Sn.

6. The thermoelectric conversion material according to claim 1, wherein:
   the fourth element is an element having a valence different from the first element.

7. The thermoelectric conversion material according to claim 6, wherein the fourth element is Cr, Fe, Mo, Ru, Rh, W, Os or Ir.

8. The thermoelectric conversion material according to claim 1, wherein:
   an atomic weight of the fourth element is larger than an atomic weight of the first element.

9. The thermoelectric conversion material according to claim 8, wherein the fourth element is Mo, Ru, Rh, W, Re, Os or Ir.

10. A thermoelectric conversion module having a thermoelectric conversion section containing the thermoelectric conversion material according to claim 1.

11. The thermoelectric conversion module according to claim 10, wherein the thermoelectric conversion section is a π type.

12. The thermoelectric conversion module according to claim 10, wherein the thermoelectric conversion section is a uni-leg type.

13. The thermoelectric conversion module according to claim 10, wherein the thermoelectric conversion section is a transverse type.

* * * * *